(12) United States Patent
Seo et al.

(10) Patent No.: US 8,423,874 B2
(45) Date of Patent: Apr. 16, 2013

(54) TRANSMITTER AND RECEIVER FOR TERRESTRIAL DIGITAL MULTIMEDIA BROADCASTING

(75) Inventors: Jae Hyun Seo, Daejeon (KR); Sung Ik Park, Daejeon (KR); Jeongchang Kim, Daejeon (KR); Heung Mook Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 256 days.

(21) Appl. No.: 12/907,511

(22) Filed: Oct. 19, 2010

(65) Prior Publication Data

US 2011/0154164 A1 Jun. 23, 2011

(30) Foreign Application Priority Data

Dec. 18, 2009 (KR) .......... 10-2009-0127233

(51) Int. Cl.
*H03M 13/00* (2006.01)
(52) U.S. Cl.
USPC ............... 714/784; 714/792; 714/786
(58) Field of Classification Search ......... 714/784, 714/792, 786
See application file for complete search history.

(56) References Cited

U.S. PATENT DOCUMENTS

| | | | |
|---|---|---|---|
| 6,956,814 B1 | 10/2005 | Campanella | |
| 2009/0116580 A1* | 5/2009 | Park et al. | 375/295 |
| 2010/0122126 A1* | 5/2010 | Choi et al. | 714/701 |
| 2011/0035648 A1* | 2/2011 | Choi et al. | 714/784 |
| 2011/0214036 A1* | 9/2011 | Kang et al. | 714/776 |
| 2012/0011420 A1* | 1/2012 | Kim et al. | 714/784 |

FOREIGN PATENT DOCUMENTS

| | | |
|---|---|---|
| JP | 4067012 | 1/2008 |
| KR | 10-2006-0072574 | 6/2006 |
| KR | 10-0705958 | 4/2007 |

* cited by examiner

*Primary Examiner* — Yolanda L Wilson
(74) *Attorney, Agent, or Firm* — Nelson Mullins Riley & Scarborough LLP; EuiHoon Lee, Esq.

(57) ABSTRACT

Provided is a terrestrial digital broadcasting transmitter. The terrestrial digital broadcasting transmitter may include a Reed-Solomon (RS) encoder to RS-encode an inputted broadcast signal, a forward error correction (FEC) encoder to channel-encode an inputted additional signal associated with the broadcast signal, a selector to select the RS-encoded broadcast signal or the channel-encoded additional signal, and a vestigial side band (VSB) transmitting part to transmit, to a receiver via a transmitting antenna, the selected signal, the selected signal being the RS-encoded broadcast signal or the channel-encoded additional signal selected by the selector.

13 Claims, 6 Drawing Sheets

TRANSMITTER AND RECEIVER FOR TERRESTRIAL DIGITAL MULTIMEDIA BROADCASTING

CROSS-REFERENCE TO RELATED APPLICATION

This application claims the benefit of Korean Patent Application No. 10-2009-0127233, filed on Dec. 18, 2009, in the Korean Intellectual Property Office, the disclosure of which is incorporated herein by reference.

BACKGROUND

1. Field of the Invention

The present invention relates to a terrestrial digital broadcasting transmitter and receiver that are compatible with a conventional terrestrial digital broadcasting system, and increase a transmission capacity.

2. Description of the Related Art

A Digital Television (DTV) transmission system based on an Advanced Television Systems Committee (ATSC) standard that is a terrestrial digital broadcasting system adopted by the United States, Canada, Mexico, South Korea, and the like may use a 6 MHz bandwidth and may have a 19.39 Mbps transmission capacity. A Digital Video Broadcasting—Terrestrial (DVB-T) standard that is a terrestrial digital broadcasting system adopted by Europe or an Integrated Services Digital Broadcasting-Terrestrial (ISDB-T) standard that is a terrestrial digital broadcasting system adopted by Japan may selectively use a transmission capacity among various transmission capacities based on a channel encoding rate or a modulation scheme, such as QPSK, 16 QAM, 64 QAM, and the like. For example, a low transmission capacity may be used for a mobile application, and a high transmission capacity may be used for stationary/fixed application.

The DTV transmission system based on the ATSC standard may apply various video signals, audio signals, data, and the like to a digital broadcasting based on a Moving Picture Expert Group-2 Transport Stream (MPEG-2 TS) multiplexing scheme within a 19.39 Mbps transmission rate that is a fixed transmission capacity. An ATSC mobile/handheld (M/H) scheme developed for the mobile reception may apply a new channel encoding scheme to a portion of an MPEG-2 TS packet for backward compatibility. However, a transmission rate of a video signal, an audio signal, and data may be deteriorated.

Figure 1:
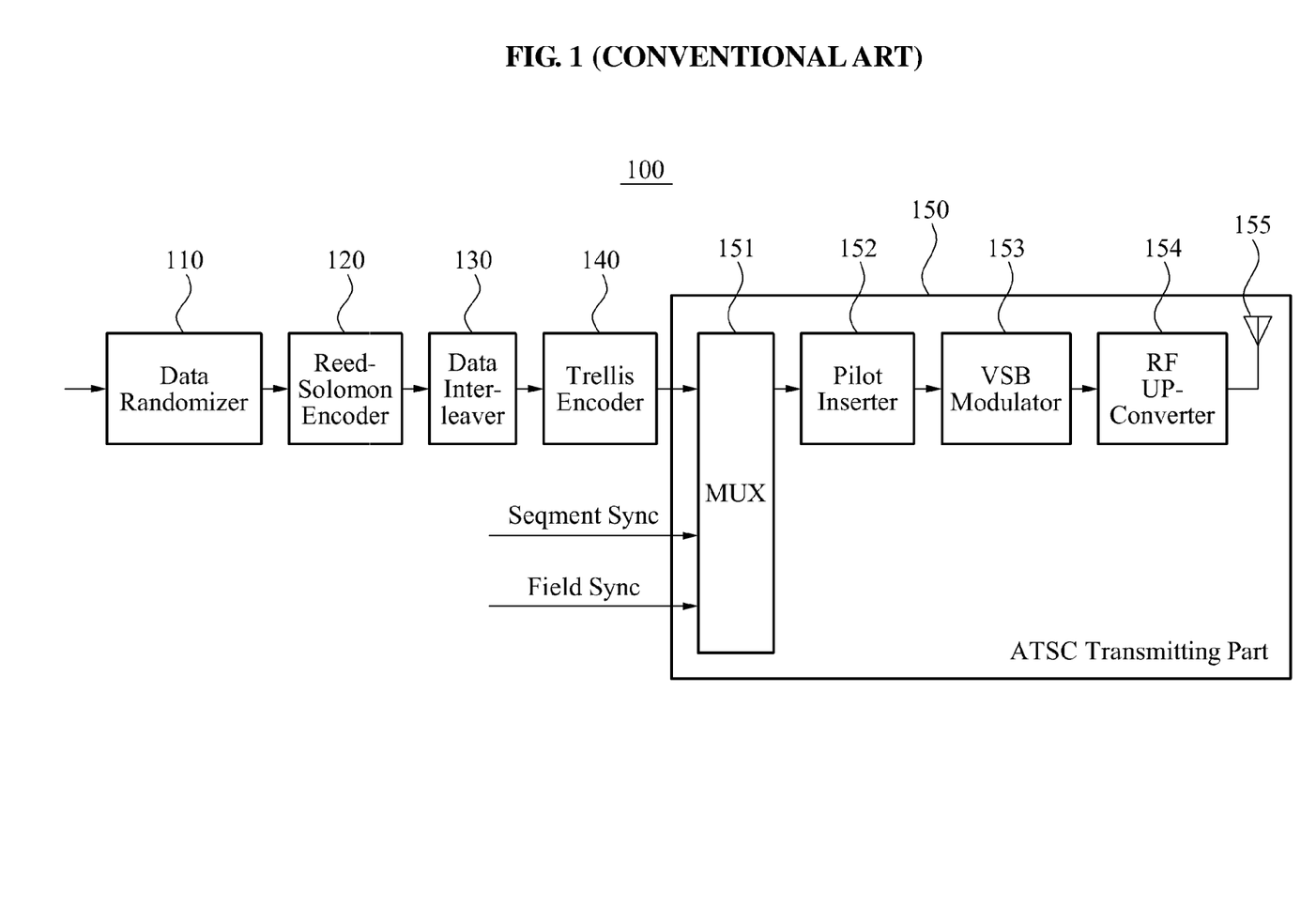
FIG. 1 is a diagram illustrating a configuration of a conventional terrestrial digital broadcasting transmitter.

FIG. 1 illustrates a configuration of a conventional terrestrial digital broadcasting transmitter 100.

Referring to FIG. 1, when a broadcast signal including a video signal, an audio signal, data, and the like, is in an MPEG-2 TS format and is received at a data rate of 19.39 Mbps, the conventional terrestrial digital broadcasting transmitter 100 may convert the broadcast signal into a random data format using a data randomizer 110, may Reed-Solomon (RS)-encode the converted broadcast signal using an RS encoder 120, may interleave the RS-encoded broadcast signal using a data interleaver 130, and trellis-encode the interleaved broadcast signal using a trellis encoder 140 to convert into a symbol format.

The terrestrial digital broadcasting transmitter 100 may multiplex the broadcast signal converted into the symbol format, a Segment Sync, and a Field Sync, using a multiplexer (MUX) 151, may insert a pilot signal into the multiplexed broadcast signal using a pilot inserter 152, may modulate based on a vestigial side band (VSB) scheme using a VSB modulator 153, may up-convert a radio frequency (RF) frequency using an RF up-converter 154, and may transmit, via a transmitting antenna 155, the modulated broadcast signal to a terrestrial digital broadcasting receiver. In this case, the MUX 151, the pilot inserter 152, the VSB modulator 153, the RF up-converter 154, and the transmitting antenna 155 may be referred to as an ATSC transmitting part 150.

Figure 2:
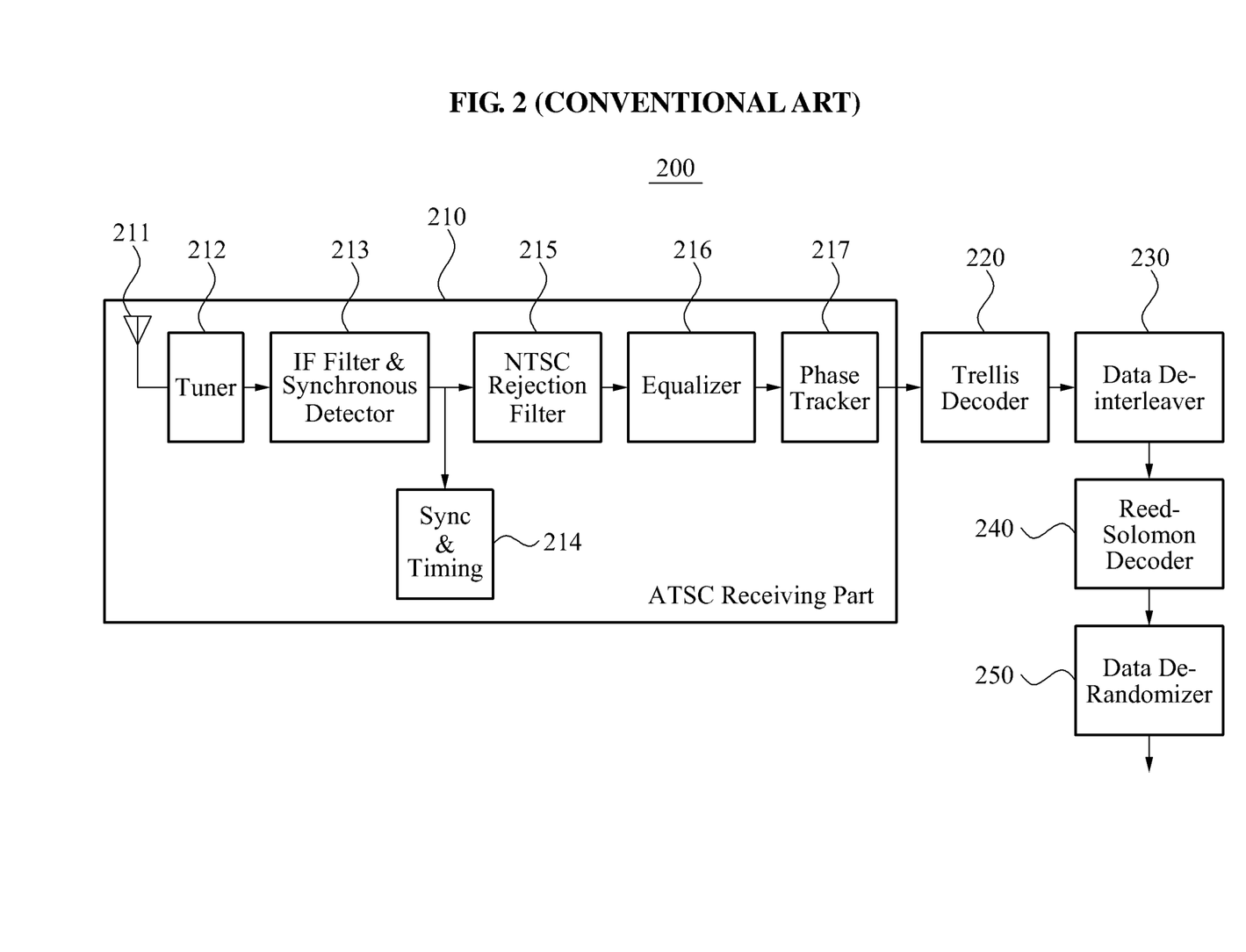
FIG. 2 is a diagram illustrating a configuration of a conventional terrestrial digital broadcasting receiver.

FIG. 2 illustrates a configuration of a conventional terrestrial digital broadcasting receiver 200.

Referring to FIG. 2, the conventional terrestrial digital broadcasting receiver 200 may receive, via a receiving antenna 211, a broadcast signal transmitted from the terrestrial digital broadcasting receiver 100, may select a signal from a desired channel to convert the signal into an intermediate frequency (IF) signal using a tuner 212, may perform an IF filtering and detecting of synchronization using an IF filter & synchronous detector 213, may synchronize a time and a frequency using a sync & timing 214, may perform filtering to remove a National Television System Committee (NTSC) signal from an NTSC rejection filter 215, may remove, using the equalizer 216, an effect from a multi-path channel through which the broadcast signal has been passed, and may remove a phase distortion component using a phase tracker 217.

The terrestrial digital broadcasting receiver 200 may perform trellis-decoding in a trellis decoder 220, may deinterleave data using a data deinterleaver 230, may RS-decode the data using an RS decoder 240, and may restore, based on the random data format, an MPEG-2 TS packet" in a data derandomizer 250. The MPEG-2 TS format is a format of the data transmitted from the terrestrial digital broadcasting transmitter 100. In this case, the receiving antenna 211, the tuner 212, the IF filter & synchronous detector 213, the sync & timing 214, the NTSC rejection filter 215, the equalizer 216, and the phase tracker 217 may be referred to as an ATSC receiving part 210.

SUMMARY

An aspect of the present invention provides a terrestrial digital broadcasting transmitter and receiver that may use a time division multiplexing (TDM) scheme and a new channel encoding scheme and thus, may maintain backward compatibility with a conventional terrestrial digital broadcasting system, and may increase a transmission capacity.

According to an aspect of the present invention, there is provided a terrestrial digital broadcasting transmitter, and the terrestrial digital broadcasting transmitter includes a Reed-Solomon (RS) encoder to RS-encode an inputted broadcast signal, a forward error correction (FEC) encoder to channel-encode an inputted additional signal associated with the broadcast signal, a selector to select the RS-encoded broadcast signal or the channel-encoded additional signal, and a vestigial side band (VSB) transmitting part to transmit, to a receiver via a transmitting antenna, the selected signal, the selected signal being the RS-encoded broadcast signal or the channel-encoded additional signal selected by the selector.

According to another aspect of the present invention, there is provided a terrestrial digital broadcasting receiver, and the receiver includes an RS decoder to RS-decode an RS encoded broadcast signal included in a signal transmitted from a transmitter and an FEC decoder to channel-decode a channel-encoded additional signal included in the signal.

According to another aspect of the present invention, there is provided a terrestrial digital broadcasting transmitter, and the terrestrial digital broadcasting transmitter includes an RS encoder to RS-encode an inputted broadcast signal, a data interleaver to perform interleaving of the RS-encoded broadcast signal to generate a first encoded signal, a trellis encoder to trellis-encode the generated first encoded signal to generate a first symbol, an FEC encoder to channel-encode an inputted additional signal associated with the broadcast signal, a symbol mapper to symbol-map the channel-encoded additional signal to generate a second symbol, a selector to select the generated first symbol or the generated second symbol, and a VSB transmitting part to transmit, to the receiver, the selected signal, the selected signal being the generated first symbol or the generated second symbol selected by the selector.

According to another aspect of the present invention, there is provided a terrestrial digital broadcasting receiver, and the receiver includes a VSB receiving part to receive, via a receiving antenna, a signal transmitted from a transmitter, a trellis decoder to trellis-decode the received signal to generate a first encoded signal when the received signal is in a symbol format, a data deinterleaver to perform deinterleaving of the generated first encoded signal to extract an RS-encoded broadcast signal from the signal, an RS decoder to RS-decode the extracted RS-encoded broadcast signal, a symbol demapper to symbol-demap the symbol to extract a channel-encoded additional signal from the signal, and an FEC decoder to channel-decode the extracted channel-encoded additional signal.

Additional aspects, features, and/or advantages of the invention will be set forth in part in the description which follows and, in part, will be apparent from the description, or may be learned by practice of the invention.

EFFECT

According to embodiments, a time division multiplexing (TDM) scheme and a new channel encoding scheme is added to a conventional terrestrial digital broadcasting system and thus, backward compatibility is maintained and transmission capacity is increased.

According to embodiments, a transmission rate is not deteriorated for a mobile broadcasting and a transmission capacity of 19.39 Mbps is maintained or increased in an Advanced Television Systems Committee (ATSC)-based scheme that is a terrestrial digital broadcasting system, originally intended for stationary reception.

According to embodiments, a terrestrial digital broadcasting transmitter is configured to function the same as a transmitting antenna in a multiplexer (MUX) unit in a conventional terrestrial digital broadcasting transmitter, and a terrestrial digital broadcasting receiver is configured to function the same as a phase tracker of a receiving antenna in the conventional terrestrial digital broadcasting receiver and thus, backward compatibility with the conventional terrestrial digital broadcasting system is maintained, and total transmission capacity may increase by adding a part of channel encoding.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Reference will now be made in detail to embodiments of the present invention, examples of which are illustrated in the accompanying drawings, wherein like reference numerals refer to the like elements throughout. Embodiments are described below to explain the present invention by referring to the figures.

Figure 3:
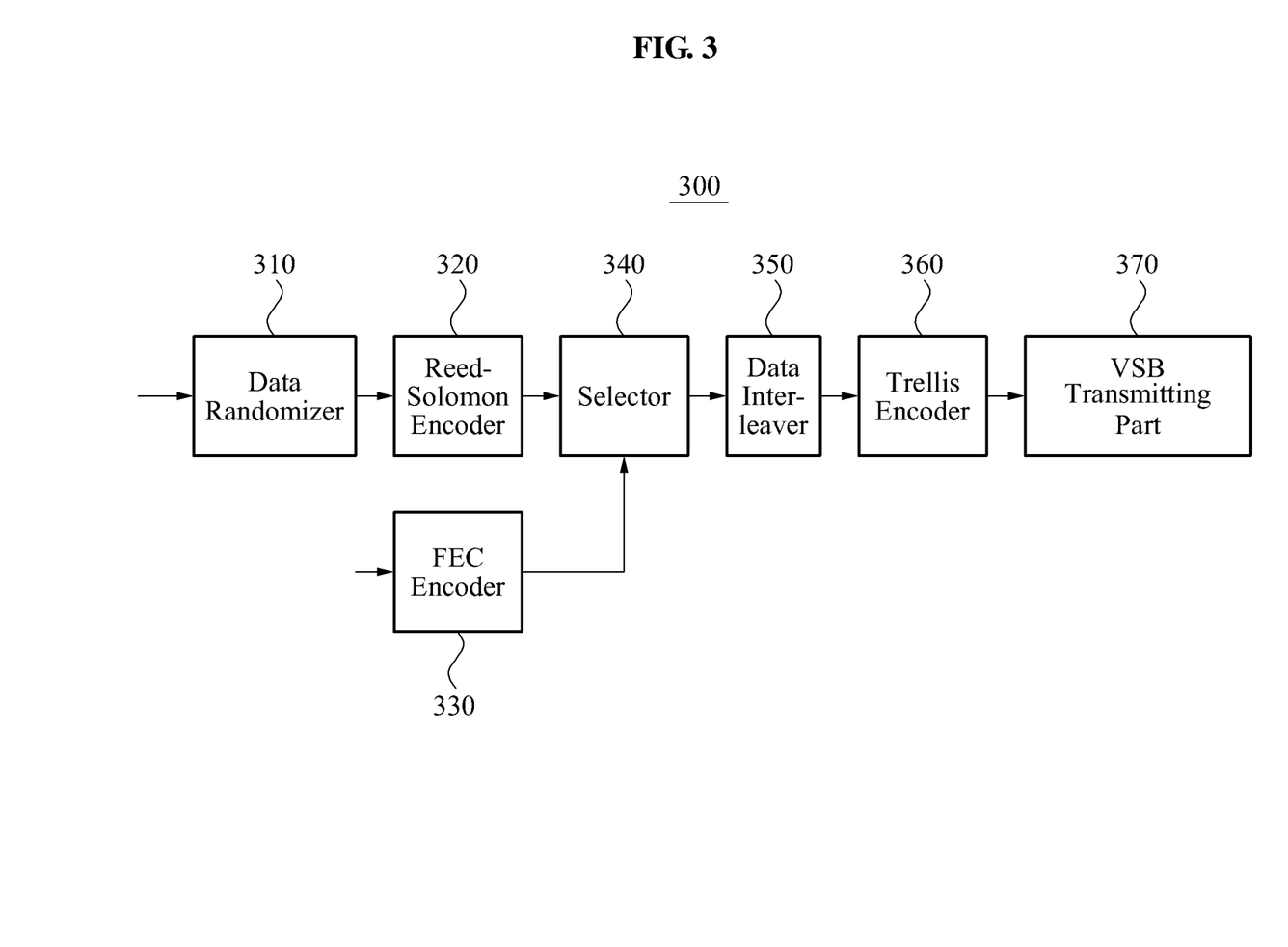
FIG. 3 is a diagram illustrating a configuration of a terrestrial digital broadcasting transmitter according to an embodiment of the present invention.

FIG. 3 illustrates a configuration of a terrestrial digital broadcasting transmitter 300 according to an embodiment of the present invention.

Referring to FIG. 3, the terrestrial digital broadcasting transmitter 300 may include a randomizer 310, a Reed-Solomon (RS) encoder 320, a forward error correction (FEC) encoder 330, a selector 340, a data interleaver 350, a trellis encoder 360, and a vestigial side band (VSB) transmitting part 370.

The RS encoder 320 may RS-encode an inputted broadcast signal. When the broadcast signal including a video signal, an audio signal, data, and the like, is in a Moving Picture Experts Group-2 Transport Stream (MPEG-2 TS) format and is inputted at a data rate of up to 19.39 Mbps, the data randomizer 310 may convert the inputted broadcast signal into a random data format, and the RS encoder 320 may RS-encode the broadcast signal that is in the random data format and received from the data randomizer 310.

For example, the RS encoder 320 may RS-encode an inputted 187 byte broadcast signal using an additional 20 bytes for parity, to output a 207 byte RS-encoded broadcast signal. Therefore, the RS encoder 320 may have an RS encoding rate of 187/207.

The FEC encoder 330 may channel-encode an inputted additional signal associated with the broadcast signal.

For example, the FEC encoder 330 may include a turbo code having an excellent error correction capability or a low-density parity-check code (LDPC). The FEC encoder 330 may encode at least one of a video signal, an audio signal, and data included in the inputted additional signal into an MPEG-2 format having a low data rate or another data stream format.

In this case, the FEC encoder 330 may channel-encode the additional signal based on an RS encoding rate of the RS encoder 320. For example, when the RS encoding rate of the RS encoder 320 is 187/207, the FEC encoder 330 may use a channel encoding rate higher than 187/207 and may channel-encode the inputted additional signal and thus, may increase a total data transmission rate.

The selector 340 may select the RS-encoded broadcast signal or the channel-encoded additional signal, and the VSB transmitting part may transmit, via a transmitting antenna, the selected signal to the terrestrial digital broadcasting receiver 400, the selected signal being the RS-encoded broadcast signal or the channel-encoded additional signal selected by the selector 340.

In this case, a signal input to the VSB transmitting part 370 is fixed as a 10.76 Mbps symbol. The selector 340 may alternately select the RS-encoded broadcast signal or the channel-encoded additional signal based on a time division multiplexing (TDM) scheme to input the selected signal to the VSB transmission part 370 and thus, a predetermined data rate may be maintained.

In this case, the data interleaver 350 may interleave the RS-encoded broadcast signal selected by the selector 340 to generate a first encoded signal, or may interleave the channel-encoded additional signal selected by the selector 340 to generate a second encoded signal.

The trellis encoder 360 may trellis-encode the first encoded signal or the second encoded signal to generate a symbol, and may input the signal in a symbol format to the VSB transmitting part 370. The VSB transmitting part 370 may modulate the inputted symbol based on a VSB scheme, and may transmit, via the transmitting antenna, the modulated symbol to the terrestrial digital broadcasting receiver 400.

In this case, the VSB transmitting part 370 may be configured to function the same as the conventional ATSC transmitting part 150 of FIG. 1 and thus, may have backward compatibility with the conventional terrestrial digital broadcasting system.

The terrestrial digital broadcasting transmitter 300 may maintain the backward compatibility with the conventional terrestrial digital broadcasting system, may not deteriorate a transmission rate for a mobile broadcasting using a TDM scheme and a FEC scheme, and may have a transmission capacity of at least 19.39 Mbps, originally intended for a stationary reception.

Figure 4:
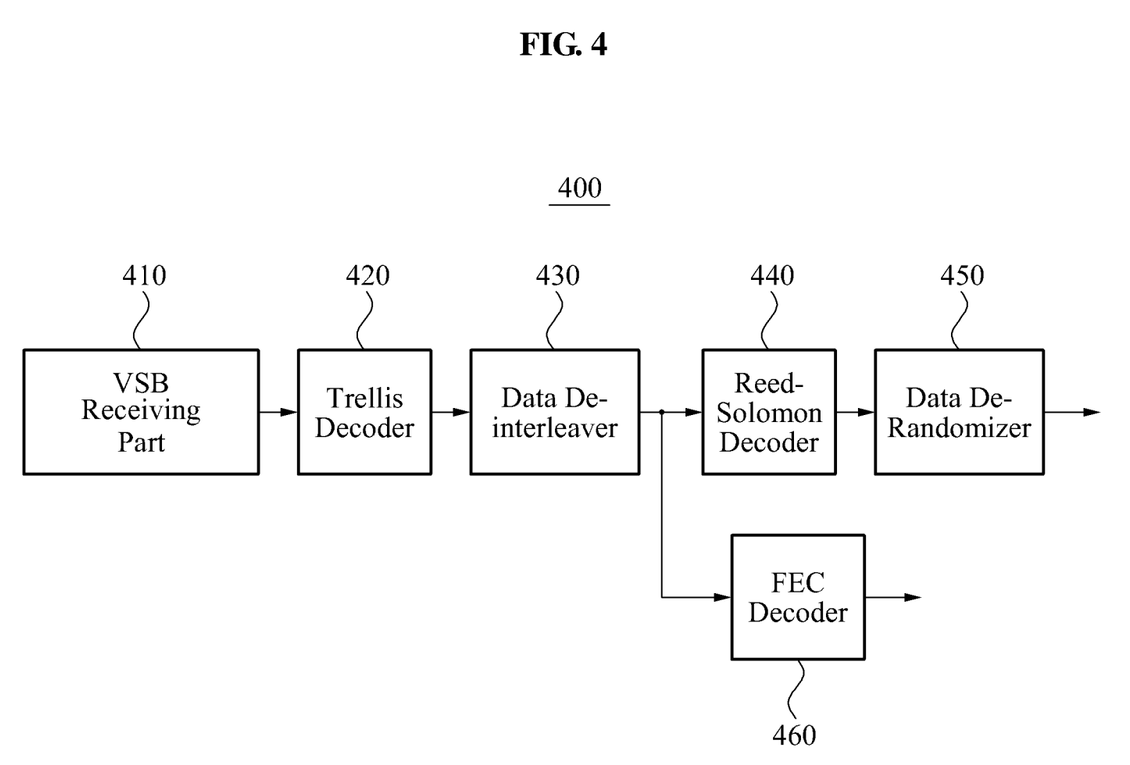
FIG. 4 is a diagram illustrating a configuration of a terrestrial digital broadcasting receiver according to an embodiment of the present invention.

FIG. 4 illustrates a configuration of a terrestrial digital broadcasting receiver 400 according to an embodiment of the present invention.

Referring to FIG. 4, the terrestrial digital broadcasting receiver 400 may include a VSB receiving part 410, a trellis decoder 420, a data deinterleaver 430, a RS decoder 440, a derandomizer 450, and an FEC decoder 460.

The RS decoder 440 may RS-decode the RS-encoded broadcast signal included in a signal transmitted from a terrestrial digital broadcasting transmitter.

The FEC decoder 460 may channel-decode a channel-encoded additional signal included in the signal.

The VSB receiving part 410 may receive, via a receiving antenna, the signal transmitted from a terrestrial digital broadcasting transmitter. The VSB receiving part 410 may perform a phase-tracking with respect to the received signal, and, when the signal includes a symbol, the trellis decoder 420 may trellis-decode the symbol to generate a decoded symbol.

The data deinterleaver 430 may deinterleave the encoded signal to extract, from the signal, the RS-encoded broadcast signal or the channel-encoded additional signal. The data deinterleaver 430 may input the extracted RS-encoded broadcast signal to the RS decoder or may input the channel-encoded additional signal to the FEC decoder 460.

The RS decoder 440 may remove the channel-encoded additional signal from the RS encoded-broadcast signal or the channel-encoded additional signal inputted from the data deinterleaver 430, and may RS-decode the RS-encoded broadcast signal to input the RS-decoded broadcast signal to the data derandomizer 450. The data derandomizer 450 may restore data in an MPEG-2 TS format based on the broadcast signal that is in a random format and transmitted from the RS decoder 440. The MPEG-2 TS format is a format of the data transmitted from the terrestrial digital broadcasting transmitter 300.

The FEC decoder 460 may remove the RS-encoded broadcast signal from the RS-encoded broadcast signal or the channel-encoded additional signal inputted from the data deinterleaver 430, and may channel-decode the channel-encoded additional signal to restore data in an MPEG-2 TS format having a low data rate or another data stream format based on the additional signal transmitted from the terrestrial digital broadcasting transmitter 300. In this case, the FEC decoder 460 may include a turbo code having an excellent error correction capability or an LDPC.

The VSB receiving part 410 may be configured to function the same as a phase tracker unit of a receiving antenna in the conventional ATSC receiving part 210 of FIG. 2 and thus, may have backward compatibility with the conventional terrestrial digital broadcasting system.

The terrestrial digital broadcasting transmitter 300 may maintain the backward compatibility with the conventional terrestrial digital broadcasting system, may not deteriorate a transmission rate for a mobile broadcast using a TDM scheme and a FEC scheme, and may have a transmission capacity of at least 19.39 Mbps, originally intended for a stationary reception.

Figure 5:
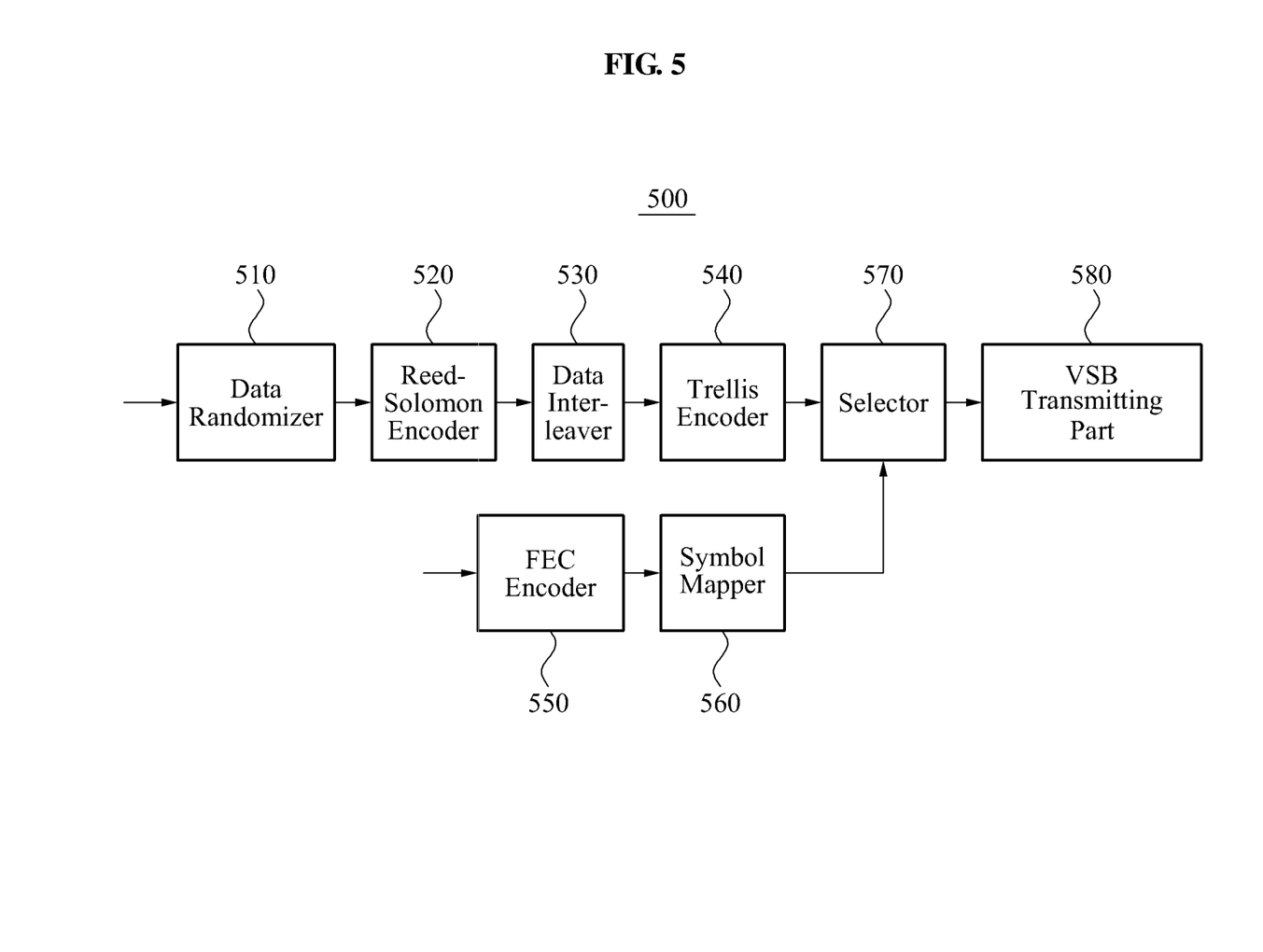
FIG. 5 is a diagram illustrating a configuration of a terrestrial digital broadcasting transmitter according to another embodiment of the present invention.

FIG. 5 illustrates a configuration of a terrestrial digital broadcasting transmitter 500 according to another embodiment of the present invention.

Referring to FIG. 5, the terrestrial digital broadcasting transmitter 500 may include a data randomizer 510, an RS encoder 520, a data interleaver 530, a trellis encoder 540, an FEC encoder 550, a symbol mapper 560, a selector 570, and a VSB transmitting part 580.

The RS encoder 520 may RS-encode an inputted broadcast signal. When a broadcast signal including a video signal, an audio signal, data, and the like is in an MPEG-2 TS format and is inputted at a data rate of up to 19.39 Mbps, the data randomizer 510 may convert the inputted broadcast signal into a random data format, and the RS encoder 520 may RS-encode the broadcast signal that is converted into the random data format and inputted from the data randomizer 510.

For example, the RS encoder 520 may RS-encode an inputted 187 byte broadcast signal using an additional 20 bytes for parity, to output a 207 byte RS-encoded broadcast signal. Therefore, the RS-encoder 520 may have an RS encode rate of 187/207.

The data interleaver 530 may interleave the RS-encoded broadcast signal inputted from the RS encoder 520 to generate a first encoded signal, and the trellis encoder 540 may trellis-encode the generated first encoded signal to generate a first symbol. For example, the trellis encoder 540 may have a trellis encoding rate of 2/3.

The FEC encoder 550 may channel-encode an inputted additional signal associated with the broadcast signal, and the symbol mapper 560 may symbol-map the channel encoded additional signal to generate a second symbol.

For example, the FEC encoder 550 may include a turbo code having an excellent error correction capability or an LDPC. The FEC encoder 550 may encode at least one of a video signal, an audio signal, and data included in the inputted additional signal into an MPEG-2 format having a low data rate or another data stream format.

In this case, the FEC encoder 550 may channel-encode the additional signal, based on an RS encoding rate of an RS encoder 520, or based on a trellis encoding rate of the trellis encoder 540. For example, when the RS encoding rate of the RS encoder 520 is 187/207 and the trellis encoding rate of the trellis encoder 540 is 2/3, the FEC encoder 330 may use a channel encoding rate higher than $(187/207)*(2/3) \approx 0.6023$, and may channel-encode the additional signal and thus, a total data transmission rate may increase.

The selector 570 may select the first symbol generated by the trellis encoder 540 or the second symbol generated by the symbol mapper 560, and the VSB transmitting part 580 may transmit, via a transmitting antenna, the selected symbol to the terrestrial digital broadcasting receiver 600, the selected symbol being the first symbol or the second symbol selected by the selector 570.

In this case, a signal inputted to the VSB transmitting part 580 is fixed at a symbol of 10.76 Mbps, and the selector 570 may alternately select the RS-encoded broadcast signal or the channel-encoded additional signal based on a TDM scheme, to input the selected signal to the VSB transmitting part 370 and thus, a predetermined data rate may be maintained.

Therefore, the VSB transmitting part 580 may modulate, based on a VSB scheme, the alternately selected symbol, the alternately selected symbol being the first symbol or the second symbol alternately selected by the selector 570 based on the TDM scheme, and may transmit the selected symbol to a terrestrial digital broadcasting receiver 600 at a fixed data rate.

In this case, the VSB transmitting part 580 may be configured to function the same as a conventional ATSC transmitting part 150 of FIG. 1 and thus, may maintain backward compatibility with the conventional digital broadcasting system.

According to an embodiment, when the TDM scheme and a new channel encoding scheme are added to the conventional terrestrial digital broadcasting system, a transmission capacity may be increased while the backward compatibility is maintained.

Figure 6:
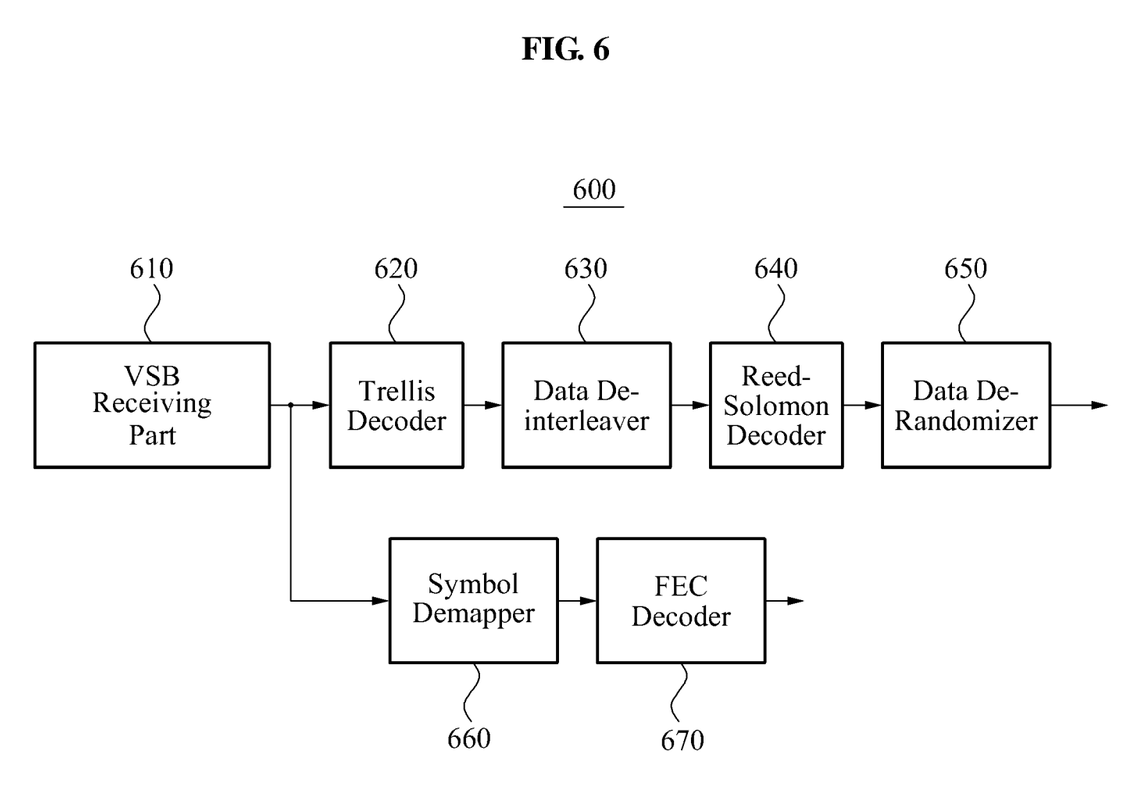
FIG. 6 is a diagram illustrating a configuration of a terrestrial digital broadcasting receiver according to another embodiment of the present invention.

FIG. 6 illustrates a configuration of a terrestrial digital broadcasting receiver 600 according to another embodiment of the present invention.

Referring to FIG. 6, the terrestrial digital broadcasting receiver 600 may include a VSB receiving part 610, a trellis decoder 620, a data deinterleaver 630, an RS decoder 640, a data derandomizer 650, a symbol demapper 660, and an FEC decoder 670.

The VSB receiving part 610 may receive, via a receiving antenna, a signal transmitted from the terrestrial digital broadcasting transmitter 500, and may perform a phase tracking with respect to the received signal.

When the received signal is in a symbol format, the trellis decoder 620 may trellis-decode the symbol to generate a first encoded signal.

The data deinterleaver 630 may deinterleave the first encoded signal, may extract the RS-encoded broadcast signal from the signal, and may input the extracted RS-encoded broadcast signal to the RS decoder 440.

The RS decoder 640 may RS-decode the extracted RS-encoded broadcast signal that is inputted from the data deinterleaver 630, and may input the decoded broadcast signal into the data derandomizer 650. The data derandomizer 650 may restore an MPEG-2 TS format based on the broadcast signal that is in a random data format and inputted from the RS decoder 640. The MPEG-2 TS format is a format transmitted from the terrestrial digital broadcasting transmitter 100.

The symbol demapper 660 may symbol-demap the symbol to extract the channel-encoded additional signal from the signal, and the FEC decoder 670 may channel-decode the extracted channel-encoded additional signal to restore an MPEG-2 TS format having a low data rate or another data stream format, based on the additional signal transmitted from the terrestrial digital broadcasting transmitter 500. In this case, the FEC decoder 460 may include a turbo code having an excellent error correction capability or an LDPC.

The VSB receiving part 610 may be configured to function the same as a phase tracker of a receiving antenna in the conventional ATSC receiving part 210 of FIG. 2 and thus, may have backward compatibility with the conventional terrestrial digital broadcasting system.

According to an embodiment, when the TDM scheme and a new channel encoding scheme are added to the conventional terrestrial digital broadcasting system, a transmission capacity may be increased while the backward compatibility is maintained.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A transmitter for a terrestrial digital broadcasting, the transmitter comprises:
   a Reed-Solomon (RS) encoder to RS-encode an inputted broadcast signal;
   a forward error correction (FEC) encoder to channel-encode an inputted additional signal associated with the broadcast signal;
   a selector to select the RS-encoded broadcast signal or the channel-encoded additional signal; and
   a vestigial side band (VSB) transmitting part to transmit, to a receiver via a transmitting antenna, the selected signal, the selected signal being the RS-encoded broadcast signal or the channel-encoded additional signal selected by the selector, the channel-encoded additional siganl not having undergone RS encoding.

2. The transmitter of claim 1, wherein the FEC encoder channel-encodes the additional signal based on an RS encoding rate of the RS encoder.

3. The transmitter of claim 1, wherein the FEC encoder encodes at least one of a video signal, an audio signal, and data included in the additional signal into a Moving Picture Experts Group 2 (MPEG-2) format or another data stream format.

4. The transmitter of claim 1, wherein the VSB transmitting part transmits, to the receiver, the RS-encoded broadcast signal or the channel-encoded additional signal which is alternately selected by the selector based on a time division multiplexing (TDM) scheme, at a fixed data rate.

5. The transmitter of claim 1, further comprising:
   a data interleaver to perform interleaving of the RS-encoded broadcast signal selected by the selector to generate a first encoded signal, or to perform interleaving of the channel-encoded additional signal selected by the selector to generate a second encoded signal; and
   a trellis encoder to trellis-encode the generated first encoded signal or the generated second encoded signal to generate a symbol,
   wherein the VSB transmitting part modulates the generated symbol based on a VSB scheme, and transmits the modulated symbol to the receiver.

6. A receiver for a terrestrial digital broadcasting, the receiver comprising:
   a receiving antenna to receive a signal transmitted from a transmitter;
   an RS decoder to RS-decode an RS encoded broadcast signal included in the signal transmitted from the transmitter; and
   an FEC decoder to channel-decode a channel-encoded additional signal included in the signal, the channel-encoded additional signal not having undergone RS encoding.

7. The receiver of claim 6, further comprising:
a trellis decoder to trellis-decode the signal to generate an encoded signal when the signal is in a symbol format; and
a data deinterleaver to deinterleave the encoded signal to extract, from the signal, the RS-encoded broadcast signal or the channel-encoded additional signal,
wherein the data deinterleaver inputs the RS-encoded broadcast signal to the RS decoder or inputs the channel-encoded additional signal to the FEC decoder.

8. A transmitter for a terrestrial digital broadcasting, the transmitter comprising:
an RS encoder to RS-encode an inputted broadcast signal;
a data interleaver to perform interleaving of the RS-encoded broadcast signal to generate a first encoded signal;
a trellis encoder to trellis-encode the generated first encoded signal to generate a first symbol;
an FEC encoder to channel-encode an inputted additional signal associated with the broadcast signal;
a symbol mapper to symbol-map the channel-encoded additional signal to generate a second symbol, the channel-encoded additional signal not having undergone RS encoding;
a selector to select the generated first symbol or the generated second symbol; and
a VSB transmitting part to transmit, to the receiver, the selected signal, the selected signal being the generated first symbol or the generated second symbol selected by the selector.

9. The transmitter of claim 8, wherein the FEC encoder channel-encodes the additional signal based on an RS encoding rate of the RS encoder, or based on a trellis encoding rate of the trellis encoder.

10. The transmitter of claim 8, wherein the FEC encoder channel-encodes at least one of a video signal, an audio signal, and data included in the additional signal into an MPEG-2 format or another data stream format.

11. The transmitter of claim 8, wherein the VSB transmitting part transmits, to the receiver, the first symbol or the second symbol which is alternately selected by the selector based on a TDM scheme, at a fixed data rate.

12. The transmitter of claim 8, wherein the VSB transmitting part modulates the selected symbol, the selected symbol being the generated first symbol or the generated second symbol selected by the selector, based on the VSB scheme and transmits the modulated symbol to the receiver.

13. A receiver for a terrestrial digital broadcasting, the receiver comprising:
a VSB receiving part to receive, via a receiving antenna, a signal transmitted from a transmitter;
a trellis decoder to trellis-decode the received signal to generate a first encoded signal when the received signal is in a symbol format;
a data de-interleaver to perform de-interleaving of the generated first encoded signal to extract an RS-encoded broadcast signal from the signal;
an RS decoder to RS-decode the extracted RS-encoded broadcast signal;
a symbol de-mapper to symbol de-map the symbol to extract a channel-encoded additional signal from the signal; and
an FEC decoder to channel-decode the extracted channel-encoded additional signal, the channel-encoded additional signal not having undergone RS encoding.

* * * * *